(12) United States Patent
Hashimoto et al.

(10) Patent No.: US 11,670,733 B2
(45) Date of Patent: Jun. 6, 2023

(54) LIGHT EMITTING DEVICE

(71) Applicant: NICHIA CORPORATION, Anan (JP)

(72) Inventors: Takuya Hashimoto, Tokushima (JP); Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/473,375

(22) Filed: Sep. 13, 2021

(65) Prior Publication Data

US 2022/0085230 A1     Mar. 17, 2022

(30) Foreign Application Priority Data

Sep. 14, 2020 (JP) .............................. JP2020-153600

(51) Int. Cl.
| | | |
|---|---|---|
| *H01L 31/12* | (2006.01) | |
| *H01L 31/0232* | (2014.01) | |
| *H01L 31/0203* | (2014.01) | |
| *H01L 31/0216* | (2014.01) | |
| *H01L 27/15* | (2006.01) | |

(52) U.S. Cl.
CPC .............. *H01L 31/12* (2013.01); *H01L 27/15* (2013.01); *H01L 31/0203* (2013.01); *H01L 31/02162* (2013.01); *H01L 31/02327* (2013.01)

(58) Field of Classification Search
CPC .................. H01L 31/12; H01L 31/0203; H01L 31/02162; H01L 31/02327; H01L 31/167; H01L 27/15; H01L 25/0753; H01L 25/167; H01S 5/02345; H01S 5/0239; H01S 5/0683; H01S 5/02255; H01S 5/02208; H01S 5/4093

See application file for complete search history.

(56) References Cited

U.S. PATENT DOCUMENTS

| | | |
|---|---|---|
| 2001/0019530 A1 | 9/2001 | Saitoh et al. |
| 2016/0277116 A1 | 9/2016 | Hasegawa et al. |
| 2016/0282174 A1 | 9/2016 | Hasegawa et al. |
| 2017/0141531 A1 | 5/2017 | Kyono et al. |
| 2021/0075982 A1* | 3/2021 | Wojciechowski ........................ H01L 27/14621 |

FOREIGN PATENT DOCUMENTS

| | | |
|---|---|---|
| JP | H08-234063 A | 9/1996 |
| JP | H09-270566 A | 10/1997 |
| JP | H09-288838 A | 11/1997 |

(Continued)

*Primary Examiner* — Sitaramarao S Yechuri
(74) *Attorney, Agent, or Firm* — Foley & Lardner LLP

(57) ABSTRACT

A light emitting device includes: a first light emitting element having a light emitting surface; an optical member having a lower surface, a first reflecting surface inclined to the lower surface, transmitting part of a first light emitted from the light emitting surface, and reflecting the rest upward, and a second reflecting surface located farther from the light emitting surface than the first reflecting surface and reflecting part or all of the first light passing through the first reflecting surface; and a photodetector located below the optical member and having a top surface provided with one or a plurality of light receiving regions including a first light receiving region configured to receive the first light reflected by the second reflecting surface. In a top view, part or all of the first light receiving region overlaps part or all of the first reflecting surface.

20 Claims, 7 Drawing Sheets

(56) References Cited

FOREIGN PATENT DOCUMENTS

| | | | |
|---|---|---|---|
| JP | H10-270748 A | | 10/1998 |
| JP | H11-150323 A | | 6/1999 |
| JP | H11150323 A | * | 6/1999 |
| JP | 2001-244542 A | | 9/2001 |
| JP | 2003-332699 A | | 11/2003 |
| JP | 2008-041918 A | | 2/2008 |
| JP | 2016-178218 A | | 10/2016 |
| JP | 2016-181645 A | | 10/2016 |
| JP | 2017-098301 A | | 6/2017 |

* cited by examiner

LIGHT EMITTING DEVICE

CROSS-REFERENCE TO RELATED APPLICATION

This application claims priority to Japanese Patent Application No. 2020-153600, filed on Sep. 14, 2020, the disclosure of which is hereby incorporated by reference in its entirety.

BACKGROUND

The present disclosure relates to a light emitting device.

An optical unit has been known in which part of the light emitted from a light emitting element is received by a photoelectric conversion element and optical control is performed based on the result of photodetection. For example, Japanese Patent Publication No. 2017-98301 discloses an optical unit including a laser diode, a mirror having a reflecting surface that reflects part of the light emitted from the laser diode, and a photodiode disposed on the back side, which is opposite side of the reflecting surface of the mirror, and receiving the light passing through the mirror.

SUMMARY

The present disclosure provides a light emitting device that can reduce the size of a package.

The light emitting device of the present disclosure, in an exemplary and non-limiting embodiment, includes a first light emitting element having a light emitting surface, an optical member, a photodetector. The optical member has a lower surface, a first reflecting surface, and a second reflecting surface. The first reflecting surface is inclined to the lower surface, transmits part of a first light emitted from the light emitting surface of the first light emitting element, and reflects the rest of the first light in an upward direction. The second reflecting surface is located farther from the light emitting surface of the first light emitting element than the first reflecting surface, and reflects part or all of the first light passing through the first reflecting surface. The photodetector is located below the optical member and has a top surface provided with one or a plurality of light receiving regions including a first light receiving region configured to receive the first light reflected by the second reflecting surface. In a top view, part or all of the first light receiving region overlaps part or all of the first reflecting surface.

According to the light emitting device according to the present disclosure, it is possible to provide a light emitting device that can reduce the size of a package.

DETAILED DESCRIPTION

Figure 1:
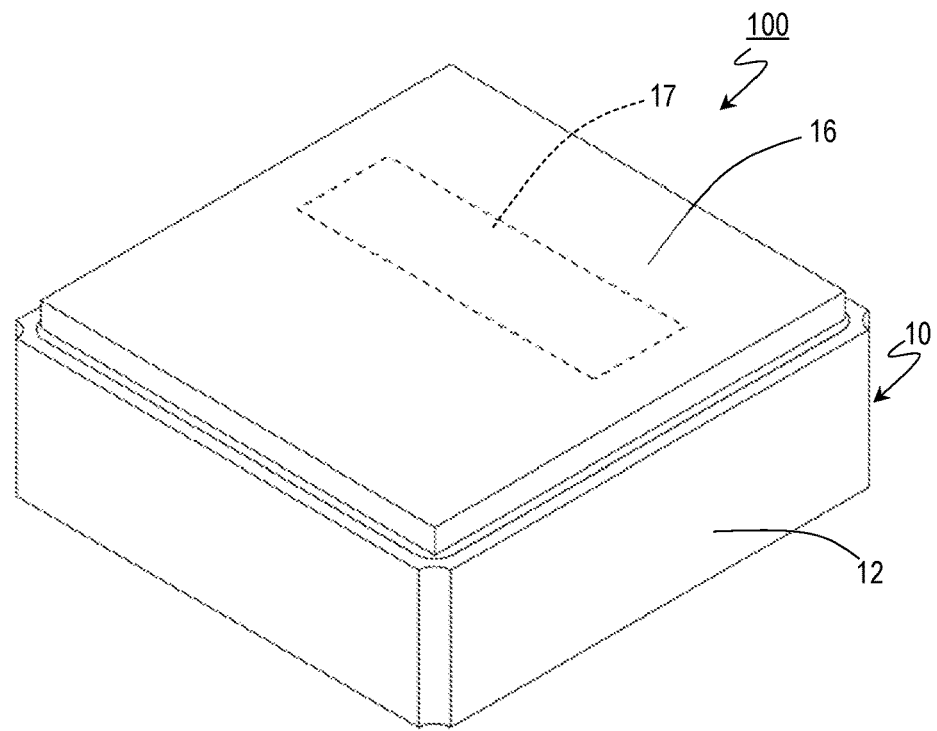
FIG. 1 is a perspective view of a light emitting device according to an embodiment of the present disclosure.

In the description or claims, polygons such as triangles, quadrangles and the like are not limited to polygons in a mathematically strict sense, and include shapes in which processing such as corner rounding, chamfering, corner cutting or the like is applied to the corners of the polygon. Further, not only the shape in which the corners (ends of sides) of the polygon are processed, but also the shape in which an intermediate portion of the side is processed is also referred to as a polygon. That is, a partially processed shape of the original polygon while remaining the original shape as the base is included in the "polygon" described in the description and claims.

The same applies not only to polygons but also to words representing specific shapes such as trapezoids, circles, protrusions, recessions and the like. Further, the same applies when dealing with each side that forms the shape. That is, even when a corner or an intermediate portion on a certain side is processed, the "side" includes the processed portion. When a "polygon" or "side" not partially processed is to be distinguished from a processed shape, "strict" will be added and described as, for example, "strict quadrangle" or the like.

In the description or claims, when there are a plurality of elements specified by a certain name and each of the elements is to be expressed separately, ordinal numbers such as "first", "second" and the like may be added to the head of each of the elements. For example, when it is stated that "light emitting elements are arranged on a substrate" in the claim, it may be described in the description that "a first light emitting element and a second light emitting element are arranged on a substrate". The ordinal numbers "first" and "second" are used simply to distinguish between two light emitting elements. There is no special meaning in the order of these ordinal numbers. Element names with the same ordinal number in a description and claims may not refer to the same element. For example, when elements specified by the terms "first light emitting element", "second light emitting element", and "third light emitting element" are described in a description, the "first light emitting element" and the "second light emitting element" in claims may correspond to the "first light emitting element" and the "third light emitting element" in the description. Further, when the term "first light emitting element" is used and the term "second light emitting element" is not used in claim 1 in scope of claims, the invention according to claim 1 may include one light emitting element, and the light emitting element is not limited to the "first light emitting element" and may be the "second light emitting element" or the "third light emitting element" in a description.

In the description or claims, terms that indicate a particular direction or position (e.g., "upper", "lower", "right", "left", "front", "back", and other terms that include these terms) may be used. These terms are used simply for clarity of relative direction or position in the reference drawings. Drawings other than the drawings disclosed in the present disclosure, actual products, manufacturing apparatuses, and the like do not have to be arranged in the same manner as the reference drawing as long as the relative relationship of direction or position as indicated by the term such as "upper", "lower" or the like in the reference drawing is the same.

The dimensions, dimensional ratios, shapes, disposal distances, and the like of the elements or members illustrated in the drawings may be exaggerated for the sake of clarity. In addition, some elements may be omitted in order to avoid over-complexity of the drawings.

An embodiment of the present invention is described below with reference to the drawings. The embodiment embodies the technical idea of the present invention, but does not limit the present invention. The numerical values, shapes, materials, order of processing steps, and the like, illustrated in the description of the embodiment are merely examples, and various modifications can be made as long as there is no technical contradiction. In the following description, elements specified by the same name and symbol are the same or similar elements, and duplicate description of these elements may be omitted.

Figure 2:
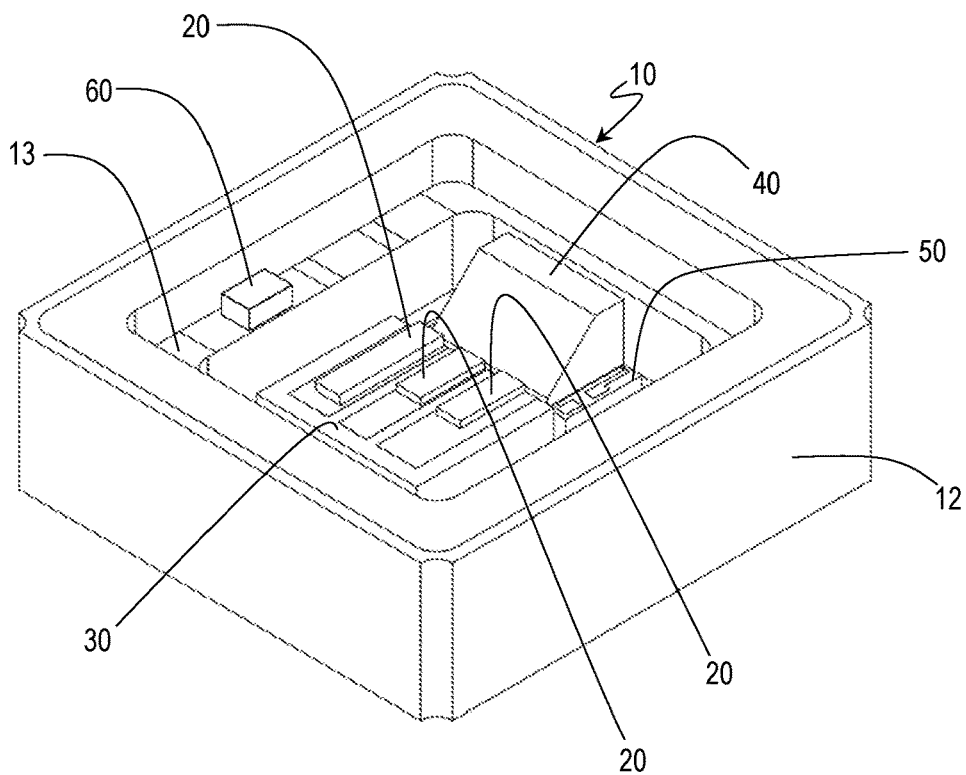
FIG. 2 is a perspective view of the light emitting device according to the embodiment of the present disclosure in a state in which a lid portion of a package is removed.
Figure 3:
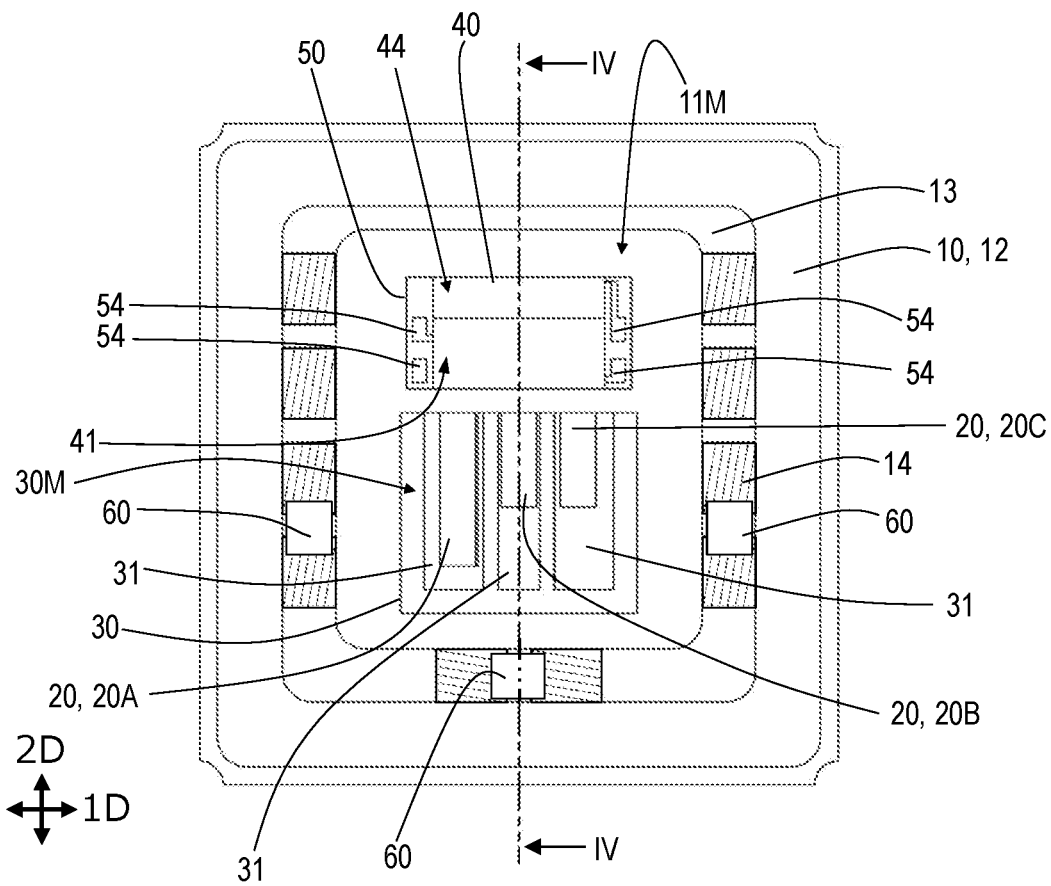
FIG. 3 is a top view of the light emitting device according to the embodiment of the present disclosure in the state in which the lid portion of the package is removed.
Figure 4:
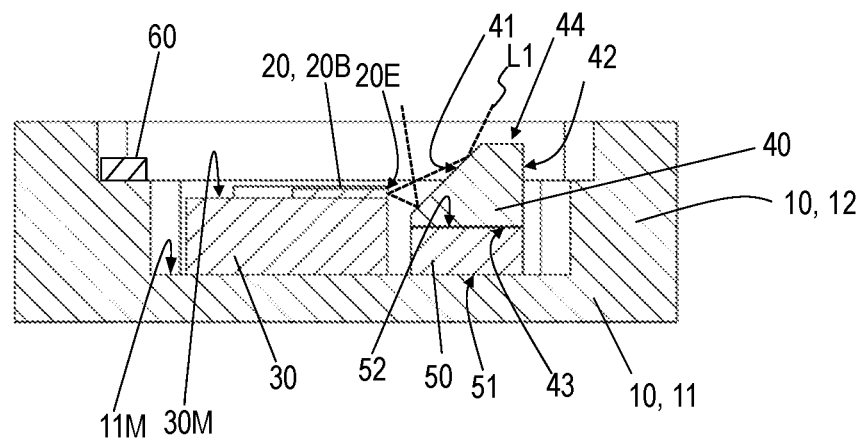
FIG. 4 is a cross-sectional view taken along a line IV-IV in FIG. 3.
Figure 5:
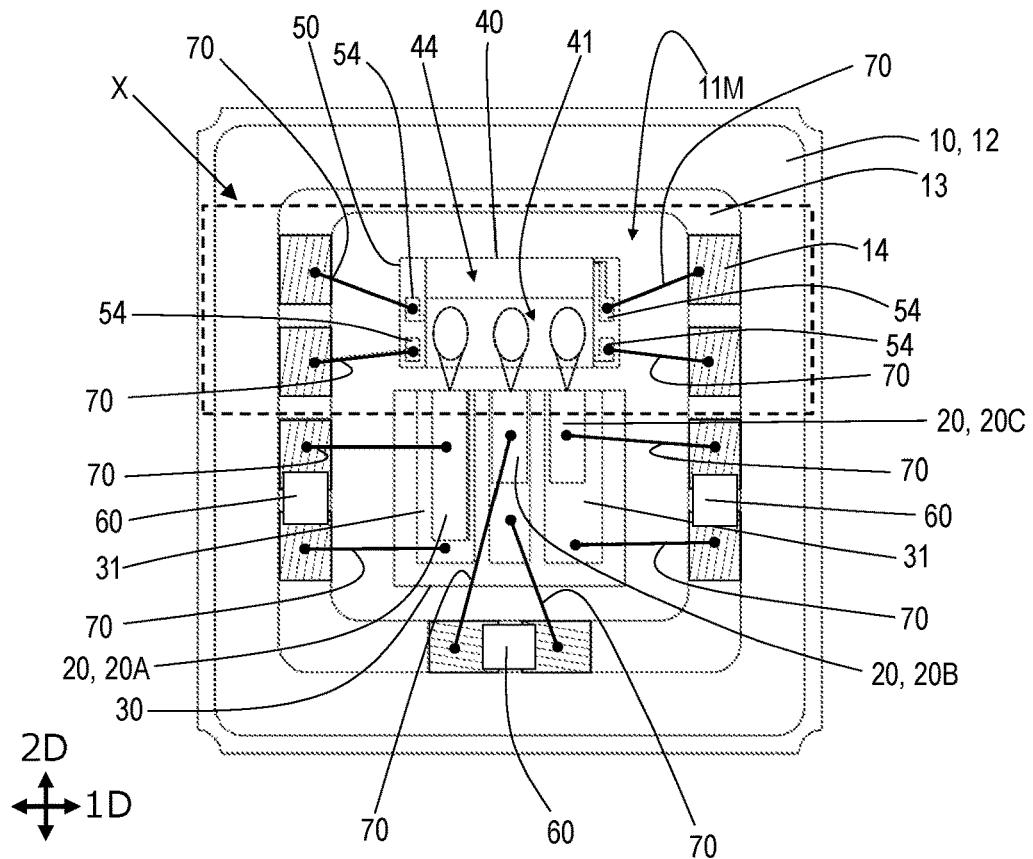
FIG. 5 is a top view illustrating an example of wiring inside the package.
Figure 6:
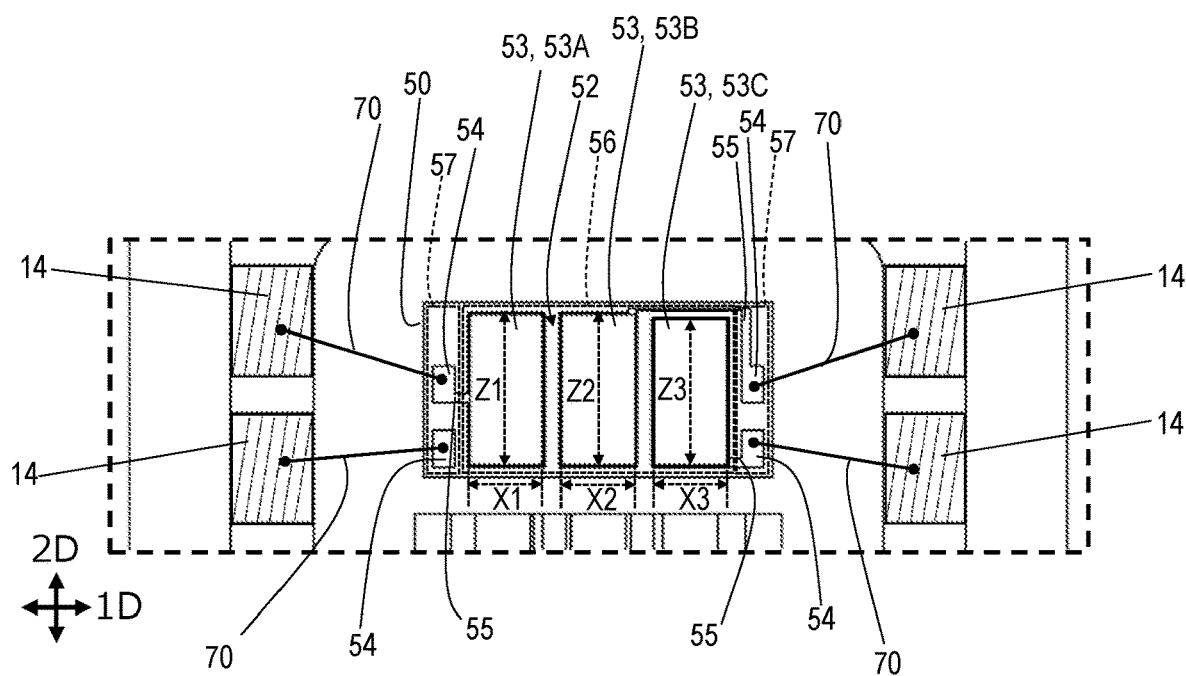
FIG. 6 is an enlarged view of portion X in the top view illustrated in FIG. 5 in a state in which an optical member is removed from the light emitting device according to the embodiment of the present disclosure.
Figure 7:
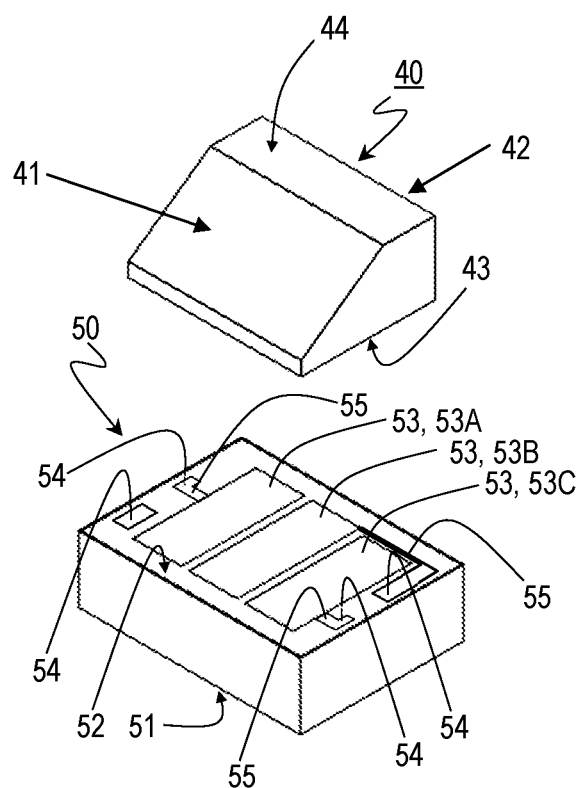
FIG. 7 is an exploded perspective view illustrating a state in which the optical member is separated from a photodetector.

A light emitting device 100 according to the present embodiment will be described. FIG. 1 to FIG. 7 are drawings for explaining an exemplary embodiment of the light emitting device 100. FIG. 1 is a perspective view of the light emitting device 100 according to the present embodiment. FIG. 2 is a perspective view of the light emitting device 100 in a state in which a lid portion 16 of a package 10 is removed. FIG. 3 is a top view of the light emitting device 100 in the state in which the lid portion 16 of the package 10 is removed. FIG. 4 is a cross-sectional view taken along a line IV-IV in FIG. 3. FIG. 5 is a top view illustrating an example of wiring inside the package 10. FIG. 6 is an enlarged view of a portion X in the top view illustrated in FIG. 5. Note that an optical member 40 illustrated in FIG. 5 is not illustrated in FIG. 6 for the sake of explanation. FIG. 7 is an exploded perspective view illustrating a state in which a photodetector 50 is separated from the optical member 40.

In order to avoid complicating the drawings, wire 70 may not be illustrated in some drawings. In FIGS. 3 and 5, instead of attaching reference numerals 14 to all wiring regions, the same hatching is applied to all the wiring regions. The broken line illustrating the portion X in FIG. 5 is a virtual line for convenience of explanation. In FIGS. 4 and 5, a main portion of a light emitted from a light emitting element 20 is indicated by a broken line, and in FIG. 5, elliptical irradiated regions on a reflecting surface of the optical member 40, which are irradiated with the main portion of the light, are also indicated by broken lines.

The light emitting device 100 according to the present embodiment includes a plurality of constituent elements including the package 10, one or a plurality of light emitting elements 20, one or a plurality of submounts 30, the optical member 40, the photodetector 50, one or a plurality of protecting elements 60, and the one or the plurality of wires 70.

In the illustrated example of the light emitting device 100, in the space inside the package 10, the plurality of light emitting elements 20 (specifically, three light emitting elements 20), the one submount 30, the one optical member 40, the one photodetector 50, the same number of protecting elements 60 as the light emitting elements 20 (specifically, three protecting elements 60), and the plurality of wires 70 are disposed. Further, each light emitted from the plurality of light emitting elements 20 is reflected upward by the reflecting surface of the optical member 40, passes through a transmissive region of the package 10, and exits to the outside from a light extracting surface 17.

First, each of the constituent elements will be described.

Package 10

The package 10 includes a bottom portion 11 having a mounting surface 11M (or an arrangement region) on which other constituent elements are disposed, a lateral wall portion 12 surrounding the mounting surface 11M, and the lid portion 16 fixed to a top surface of the lateral wall portion 12. In addition, the package 10 has a recessed portion constituted of the mounting surface 11M and the lateral wall portion 12. The recessed portion is recessed in an up to down direction of the package 10. Here, a surface that is a bottom of the recessed portion is referred to as a bottom surface. The bottom surface can be the main part of the mounting surface 11M.

In a top view from the normal direction of the mounting surface 11M, the outer shape of the package 10 is rectangular. In a top view, the outer shape of the bottom surface of the package 10 is rectangular. The outer shape of the package 10 includes the outer shape of the bottom surface of the package 10. Note that none of these outer shapes needs to be rectangular.

The bottom portion 11 is a portion that constitutes the mounting surface 11M of the package 10 and includes the bottom surface and a lower surface of the package 10. The lateral wall portion 12 is a portion that surrounds the mounting surface 11M of the package 10 and constitutes a lateral wall that extends upward from the mounting surface 11M. The lateral wall portion 12 includes one or more outer surfaces of the package 10, one or more inner surfaces of the package 10, and a top surface in contact with the outer surface and the inner surface of the package 10.

The package 10 has one or more stepped portions 13. The stepped portion 13 is provided in the recessed portion of the package 10. Here, the stepped portion 13 refers to a portion constituted of a top surface and an inner surface that is in contact with the top surface and extends downward. In other words, the stepped portion 13 does not include the inner surface that is in contact with the top surface of the stepped portion 13 and extends upward. The stepped portion 13 is a part of the lateral wall portion 12 of the package 10. The stepped portion 13 is located below the top surface of the package 10. The stepped portion 13 has a stepped structure and is formed along the lateral wall of the package 10. Further, the stepped portion 13 may be formed along the entire circumference of the lateral wall surrounding the mounting surface 11M. Note that the stepped portion 13 does not have to be formed along the entire circumference.

The stepped portion 13 has regions having different widths in a top view. The width of the stepped portion 13 is a length in a direction perpendicular to the lateral wall in a top view, when exemplifying the portion formed along the lateral wall of the package 10. When distinguishing between two regions having different widths in the stepped portion 13, the wider portion is referred to as a wide portion and the narrower portion is referred to as a narrow portion. In the illustrated example of the package 10, the stepped portion 13 is formed along four sides of the rectangle in a top view, a portion along three sides thereof is the wide portion, and a portion along the remaining one side is the narrow portion.

One or a plurality of wiring regions 14 are provided on the top surface of the stepped portion 13. In the illustrated example of the package 10, the plurality of wiring regions 14 are provided. The wiring region 14 is electrically connected to a wiring region provided on the lower surface of the package 10, through the inside of the package 10. Note that the wiring region electrically connected to the wiring region 14 is not limited to the lower surface of the package 10, and can be provided on another outer surface (top surface or outer surface) of the package 10.

The bottom portion 11 and lateral wall portion 12 of the package 10 can be formed of, for example, ceramic as a main material. Examples of ceramic to be used include aluminum nitride, silicon nitride, aluminum oxide, silicon carbide and the like.

The package 10 can be formed by integrally forming the bottom portion 11 and the lateral wall portion 12. For example, the package 10 may be manufactured from a member in which the bottom portion 11 and the lateral wall portion 12 are integrated using a processing technique such as molding, etching or the like. Alternatively, the package 10 may be manufactured by joining the bottom portion 11 and the lateral wall portion 12, which are formed separately using different materials as main materials. In this case, for example, the bottom portion 11 may be formed of metal as the main material, and the lateral wall portion 12 may be formed of ceramic as the main material. In addition, in this case, the bottom portion 11 preferably includes a material having better heat dissipation (material having higher thermal conductivity) than that of the ceramic used as the main material of the lateral wall portion 12. Examples of such materials may include copper, aluminum, iron, copper molybdenum, copper tungsten, and copper-diamond composites.

The lid portion 16 has a lower surface and a top surface, and is a rectangular parallelepiped flat plate-shaped member. However, the lid portion 16 does not have to be the rectangular parallelepiped. The lid portion 16 is fixed to the top surface of the lateral wall portion 12 above the bottom portion 11.

The lid portion 16 has the light extracting surface 17 that has a transmissive region which is a region having transmissivity. The lid portion 16 may partially have a non-transmissive region which is a region having no transmissivity. The light extracting surface 17 is included in the top surface of the lid portion 16. Note that "having transmissivity" means having a property that the transmissivity of the main light incident therein is 80% or greater.

The lid portion 16 may be formed using sapphire. Sapphire is a material that has transmissivity, has a relatively high refractive index, and has relatively high strength. The lid portion 16 may be formed of a transmissive material such as glass, plastic, quartz and the like, in addition to sapphire.

The package 10 may have dimensions of, for example, a height of 3 mm or less, and in a top view, a side length of 10 mm or less in a rectangular outer shape. Further, the package 10 may have dimensions of, for example, a height of 2 mm or less, and in a top view, a side length of 7 mm or less in a rectangular outer shape.

Light Emitting Element 20

An example of the light emitting element 20 is a semiconductor laser element. The light emitting element 20 may have a rectangular outer shape in a top view. When the light emitting element 20 is an edge emitting semiconductor laser element, a side surface in contact with one of the two short sides of the rectangle is a light emitting surface 20E. In this example, a top surface and a lower surface of the light emitting element 20 have a larger area than the light emitting surface 20E. The light emitting element 20 is not limited to the edge emitting semiconductor laser element, and may be a surface emitting semiconductor laser element or a light emitting diode (LED).

The light emitting element 20 in the present embodiment includes one or more emitters. The light emitting element 20 may be a single emitter having one emitter or may be a multi-emitter having two or more emitters. In the example of FIG. 5, a light is emitted from the light emitting element 20 which is the single emitter.

Here, the description of the case in which the light emitting element 20 is the semiconductor laser element will be added. The light (laser light) emitted from the light emitting surface 20E of the semiconductor laser element is a divergent light having divergency. The laser forms an elliptical far-field pattern (hereinafter referred to as "FFP") on a plane parallel to the light emitting surface 20E. The FFP is a shape or light intensity distribution of the emitted light at a position away from the light emitting surface.

The light passing through the center of the elliptical shape of the FFP, in other words, the light having peak intensity in the light intensity distribution of the FFP, is referred to as a light traveling on the optical axis. Further, the optical path of the light traveling on the optical axis is referred to as the optical axis of the light. In addition, in the light intensity distribution of the FFP, the light having intensity of $1/e^2$ or more to the peak intensity value is referred to as a light in a "main portion".

In the elliptical shape of the FFP of the light emitted from the light emitting element 20 which is the semiconductor laser element, the minor axis direction of the ellipse is referred to as the slow axis direction, and the major axis direction is referred to as the fast axis direction. A plurality of layers including an active layer that constitute the semiconductor laser element are layered in the fast axis direction.

Based on the light intensity distribution of the FFP, the angle corresponding to $1/e^2$ of the light intensity distribution is defined as the light divergence angle of the semiconductor laser element. The light divergence angle in the fast axis direction is defined as the divergence angle to the fast axis direction, and the light divergence angle in the slow axis direction is defined as the divergence angle to the slow axis direction.

As the light emitting element 20, for example, a semiconductor laser element emitting a blue light, a semiconductor laser element emitting a green light, a semiconductor laser element emitting a red light or the like can be employed. Further, a semiconductor laser element that emits a light of a color other than these colors may be employed.

Here, a blue light refers to light having an emission peak wavelength within a range from 420 nm to 494 nm. A green light refers to light having an emission peak wavelength within a range from 495 nm to 570 nm. A red light refers to light having an emission peak wavelength within a range from 605 nm to 750 nm.

Examples of the semiconductor laser element that emits the blue light or the semiconductor laser element that emits the green light include a semiconductor laser element using a nitride semiconductor. For example, GaN, InGaN, and AlGaN can be used as the nitride semiconductors. Examples of semiconductor laser element that emits the red light include InAlGaP-based, GaInP-based, GaAs-based, and AlGaAs-based semiconductors.

Submount 30

The submount 30 has two joint surfaces and is configured in a rectangular parallelepiped shape. On the opposite side of the one joint surface, the other joint surface is provided. The distance between the two joint surfaces is shorter than the distances between the facing surfaces of the respective remaining two pairs. The shape of the submount 30 is not limited to a rectangular parallelepiped. The submount 30 can be formed using, for example, silicon nitride, aluminum nitride, or silicon carbide. A metal film for joining is provided on the joint surface. One or a plurality of wiring regions electrically connected to other constituent elements can be provided on the one joint surface of the submount 30.

Optical Member 40

An example of the optical member 40 has the shape of a prism. The prism is a pillar with a polygonal bottom surface. Examples of the bottom surface of the pillar are triangle, quadrangle, and pentagon. Note that the shape of the optical member 40 is not limited to the prism. The optical member 40 may be formed of a transmissive material such as, for example, glass, plastic, quartz or the like. The optical member 40 may have a plurality of reflecting surfaces. In the present embodiment, the optical member 40 has a first reflecting surface 41, a second reflecting surface 42, and a lower surface 43. The optical member 40 may further have a top surface 44 that is parallel to the lower surface 43 and is located on the opposite side of the lower surface 43. The parallelism here includes a tolerance within ±5 degrees. The top surface 44 may be in contact with the first reflecting surface 41 and the second reflecting surface 42. The optical member 40 preferably has a joint surface for fixing to another member. In the illustrated example, the lower surface 43 of the optical member 40 may function as a joint surface that is joined to a member located below the lower surface 43. Note that a surface other than the lower surface 43 of the optical member 40 may function as a joint surface that joins to another member.

The first reflecting surface 41 is configured as a flat plane that has an inclination angle, for example, in a range from 35° to 55° to the lower surface 43. In the illustrated example of the light emitting device 100, the first reflecting surface 41 is configured as the flat plane having an inclination angle of 45° to the lower surface 43. The first reflecting surface 41 is a partially reflecting surface that transmits part of the incident light and reflects the rest.

The second reflecting surface 42 is located on the opposite side of the first reflecting surface 41. Assuming that the first reflecting surface 41 is a reflecting surface provided on the front surface of the optical member 40, the second reflecting surface 42 can be referred to as a reflecting surface provided on the back surface of the optical member 40. The second reflecting surface 42 is not parallel to the lower surface 43. Also, the second reflecting surface 42 is not parallel to the first reflecting surface 41.

The first reflecting surface 41 and the second reflecting surface 42 may be formed, for example, by providing a light reflection control film, which reflects the incident light, on a transmissive material. The light reflection control film may be formed of a metal thin film such as Ag, Al or the like, for example. Alternatively, the light reflection control film may be a dielectric multilayer film formed of $Ta_2O_5/SiO_2$, $TiO_2/SiO_2$, $Nb_2O_5/SiO_2$, or the like. For example, by changing the film thickness or material of the light reflection control film, it is possible to control the reflectivity or transmissivity of the reflecting surface.

The reflectivity of the first reflecting surface 41 can be, for example, in a range from 80% to 98% to the peak wavelength of the light to be reflected, and is preferably, for example, in a range from 90% to 97%. Further, the transmissivity of the first reflecting surface 41 is preferably, for example, in a range from 3% to 10% to the peak wavelength of the light to be transmitted. The reflectivity of the second reflecting surface 42 is, for example, 99% or greater, preferably close to 100% to the peak wavelength of the light to be reflected. The second reflecting surface 42 may also be inclined at a predetermined inclination angle to the lower surface 43. This inclination will be described in detail later.

The light reflected by and the light transmitted by the first reflecting surface 41 of the optical member 40 may be used for different applications. For example, the light reflected by the first reflecting surface 41 of the optical member 40 can be used as a main portion of light for screen display or the like, and all or part of the light passing through the first reflecting surface 41 can be used as a monitor light for controlling the intensity of the main portion of light. When the incident light is branched into the main portion of light and the monitor light in this way, the intensity of the monitor light is weaker than the intensity of the main portion of light.

The reflectivity of the first reflecting surface 41 and the reflectivity of the second reflecting surface 42 can vary depending on the wavelengths of incident light. Thus, when the lights of different colors are incident on one first reflecting surface 41, the reflectivity of the lights may differ from each other corresponding to those colors. Note that it is not necessary to have an equal reflectivity for lights of all colors. The first reflecting surface 41 may be designed so as to have appropriate reflectivity for the target light to be reflected by the first reflecting surface 41. Note that even when there is a difference in specific numerical values, it is preferable that the above-mentioned conditions of reflectivity and transmissivity be satisfied for each of incident lights having different wavelengths. The same applies to the second reflecting surface 42.

When the lights of different colors are incident, the first reflecting surface 41 may have reflecting regions having reflectivities suitable for the respective wavelengths of the lights in the respective regions in which the lights of respective colors are incident. The plurality of reflecting regions corresponding to the incident regions in which the respective lights are incident may be separated from one another, or there may be regions that partially overlap between the plurality of reflecting regions.

Photodetector 50

The photodetector 50 has a joint surface 51, a light receiving surface 52, and one or a plurality of side surfaces. The joint surface 51 is a surface on which the photodetector 50 is joined to another constituent element. The joint surface 51 is located on the opposite side of the light receiving surface 52. The light receiving surface 52 is provided on a top surface of the photodetector 50. The outer shape of the photodetector 50 is a rectangular parallelepiped. Note that the shape is not limited to a rectangular parallelepiped.

The light receiving surface 52 has one or a plurality of light receiving regions 53. On the light receiving surface 52 having the plurality of light receiving regions 53, the plurality of light receiving regions 53 are provided so as to be separated from one another. The plurality of light receiving regions 53 are electrically isolated from one another. Each of the one or the plurality of light receiving regions 53 is a photoelectric conversion element that outputs an electrical signal in accordance with the intensity or the amount of incident light. A typical example of such a photoelectric conversion element is a photodiode.

In the photodetector 50 illustrated in FIGS. 6 and 7, three light receiving regions 53 are provided on the light receiving surface 52 of the photodetector 50. Note that the number of light receiving regions 53 included in the photodetector 50 is not limited to three. The plurality of light receiving regions 53 are aligned at predetermined distances. Here, a direction in which the plurality of light receiving regions 53 are aligned is referred to as a "first direction". In addition, in a top view, a direction perpendicular to the first direction is referred to as a "second direction". In the example of the light emitting device 100 in FIG. 6, arrow 1D coincides with the first direction, and arrow 2D coincides with the second direction.

An example of the outer shape of the light receiving surface 52 is a rectangle. The length of the light receiving surface 52 in the second direction is shorter than the length in the first direction. However, the relationship of size between the length in the first direction and the length in the second direction of the light receiving surface 52 does not have to be limited to this.

On the light receiving surface 52 having the plurality of light receiving regions 53, the plurality of light receiving regions 53 are aligned close to each other. The distance between the two adjacent light receiving regions 53 is smaller than the width of one or both of the two adjacent light receiving regions 53 in the first direction (X1, X2, or X3). Consequently, the distance between the lights incident on the respective light receiving regions 53 can be brought close to each other, so that the size of the photodetector 50 can be reduced. Additionally, it is possible to independently measure the intensity of the plurality of light incident on different light receiving regions on the light receiving surface 52.

Each light receiving region 53 has a rectangular outer shape on the light receiving surface 52. The shape of the light receiving region 53 is not limited to the rectangle, and may be appropriately designed according to the shape of the light incident on the light receiving surface 52. In the illustrated example of the photodetector 50, each light receiving region 53 has a rectangular outer shape. Two of the four sides configuring the rectangle (short sides in the case of a rectangle having longer sides and shorter sides) are parallel to the first direction. The other two sides (long sides in the case of a rectangle having longer sides and shorter sides) are parallel to the second direction. The parallelism here includes a tolerance within ±5 degrees.

In the light receiving regions 53, the lengths ($Z1$, $Z2$, and $Z3$) in the second direction are longer than the lengths ($X1$, $X2$, and $X3$) in the first direction (see FIG. 6). Note that in the plurality of light receiving regions 53, there may be a light receiving region 53 having the same length in the first direction and the second direction, or a light receiving region 53 whose length in the first direction is longer than the length in the second direction.

The length of each light receiving region 53 in the first direction and the length in the second direction may vary depending on, for example, the wavelength of the light incident on the light receiving region 53. For example, in the plurality of light receiving regions 53, there may be two light receiving regions 53 that differ in length in the second direction on the light receiving surface 52. In the illustrated example of the photodetector 50, $Z3$ is smaller than $Z1$ and $Z2$.

The length of $Z2$ minus $Z1$ is, for example, in a range from 50 μm to 150 μm, preferably in a range from 60 μm to 100 μm. With this range, it is possible to secure the light receiving regions 53 having appropriate sizes while using this space for a conduction region 55.

On the light receiving surface 52 having the plurality of light receiving regions 53, the plurality of light receiving regions 53 are arranged so that either one of both ends of the respective light receiving regions 53 in the second direction are aligned. In other words, a straight line connecting the either one of both ends in the respective light receiving regions 53 in the second direction is parallel to the first direction. The parallelism here includes a tolerance within ±5 degrees. By aligning the positions of the one of both ends, the length of the photodetector 50 in the second direction can be reduced, which can contribute to reducing the size of the photodetector 50.

Note that the relationship of size and the relationship of arrangement between the plurality of light receiving regions 53 are not necessarily required for the light emitting device 100 according to the present embodiment.

The photodetector 50 has one or a plurality of wiring regions 54. The one or the plurality of wiring regions 54 may be provided on the light receiving surface 52. Note that the one or the plurality of wiring regions 54 may be provided on a surface other than the light receiving surface 52. Each wiring region 54 is electrically connected to the light receiving region 53.

In the illustrated example of the photodetector 50, four wiring regions 54 are provided for electrical connection of the three light receiving regions 53. The number of wiring regions 54 on the light receiving surface 52 of the photodetector 50 is larger than the number of light receiving regions 53 and less than twice the number of light receiving regions 53.

Three among the four wiring regions 54 are electrically connected to any one of anode electrodes among the three light receiving regions 53 without being redundantly connected to the same anode electrode. The remaining one is electrically connected to a cathode electrode common to the three light receiving regions 53.

Protecting Element 60

The protecting element 60 is a circuit element to prevent an excessive current from flowing through a specific element (e.g., the light emitting element 20) and breaking the specific element. A typical example of the protecting element 60 is a constant voltage diode such as a Zener diode. A Si diode can be used as the Zener diode.

Wire 70

The wire 70 is configured by a conductor having a linear shape with both ends as joint portions. In other words, the wire 70 has joint portions at both ends of the linear portion to join to the other constituent elements. The wire 70 is, for example, a metal wire. Examples of metals include gold, aluminum, silver, and copper.

Light Emitting Device 100

Next, the light emitting device 100 will be described.

In the example of the light emitting device 100 described below, each of the plurality of light emitting elements 20 is an edge emitting semiconductor laser element (laser diode).

However, the number of light emitting elements 20 included in the light emitting device according to the embodiment of the present disclosure is not limited to three, and may be one, two, or four or more.

The plurality of light emitting elements 20 are arranged inside the package 10. The plurality of light emitting elements 20 are arranged on the mounting surface 11M of the bottom portion 11 in the package 10 and are surrounded by the lateral wall portion 12. Further, the plurality of light emitting elements 20 are arranged on the mounting surface 11M via the submount 30. Note that the plurality of light emitting elements 20 may be arranged directly on the mounting surface 11M without using the submount 30. However, by using the submount 30, there is an advantage that the height from the mounting surface 11M to the light emitting point located on the light emitting surface 20E of the light emitting element 20 can be easily adjusted.

The plurality of light emitting elements 20 are joined to a joint surface provided on a top surface 30M of the submount 30. In addition, the mounting surface 11M is joined to a joint surface provided on the opposite side of the joint surface on the top surface 30M. Note that in the light emitting device 100, instead of arranging the plurality of light emitting elements 20 on one submount 30, a plurality of submounts 30 may be provided and one light emitting element 20 may be arranged on one submount 30.

The photodetector 50 is arranged inside the package 10. The photodetector 50 is arranged on the mounting surface 11M of the bottom portion 11 and is surrounded by the lateral wall portion 12. The light receiving surface 52 of the photodetector 50 is arranged at a position lower than the emission point of the light emitted from each light emitting element 20. Further, the photodetector 50 is preferably arranged at a position close to the light emitting element 20. In a top view, the distance between the photodetector 50 and the light emitting element 20 is preferably shorter than 300 μm. This enables the size of the light emitting device 100 to be reduced.

In the light emitting device 100 including the plurality of light emitting elements 20, the photodetector 50 may have the plurality of light receiving regions 53 corresponding to the respective lights emitted from the plurality of light emitting elements 20. The plurality of light receiving regions 53 are, for example, aligned in the first direction. Further, the photodetector 50 having the light receiving surface 52 whose length in the second direction is shorter than the length in the first direction can contribute to reducing the size of the light emitting device 100.

The optical member 40 is arranged above the photodetector 50 such that the lower surface 43 of the optical member 40 faces the light receiving surface 52 of the photodetector 50. Accordingly, the photodetector 50 is arranged between the submount 30 and the lateral wall portion 12 of the package 10 and is located below the optical member 40. The lower surface 43 of the optical member 40 is joined to the light receiving surface 52 of the photodetector 50 via, for example, an adhesive layer such as resin.

The first reflecting surface 41 is arranged so as to face toward the light emitting element 20. The first reflecting surface 41 is irradiated with the main portion of the light emitted from the light emitting element 20. The first reflecting surface 41 transmits portion of the light emitted from the light emitting surface 20E of the light emitting element 20 and reflects the rest upward. For example, the first reflecting surface 41 reflects 90% or more of the incident light and transmits the remaining light of less than 10%.

The second reflecting surface 42 is located farther from the light emitting surface 20E of the light emitting element 20 than the first reflecting surface 41, and reflects portion or all of the light passing through the first reflecting surface 41. For example, the second reflecting surface 42 reflects 99% or more of incident light. The light reflected by the second reflecting surface 42 is mainly directed toward the lower surface 43.

In a top view, part or all of the light receiving region 53 may overlap part or all of the first reflecting surface 41. In a top view, the entire light receiving region 53 overlaps the optical member 40. In a top view, part of the light receiving region 53 may overlap the first reflecting surface 41 and the remaining part may overlap the second reflecting surface 42.

The light receiving region 53 receives the light reflected by the second reflecting surface 42. Further, the light receiving region 53 may receive the light that passes through the first reflecting surface 41 of the optical member 40 and is not reflected by the second reflecting surface 42, in other words, the light that is refracted by the first reflecting surface 41 and travels toward the lower surface 43. This allows the light receiving region 53 to receive more light.

The adhesive layer interposed between the optical member 40 and the photodetector 50 functions as an intermediate refractive index layer having a refractive index higher than the refractive index of air (about 1.0) and close to the refractive index of the optical member 40. For example, the refractive index of the adhesive layer is close to the refractive index of glass (e.g., 1.5). By filling a space between the lower surface 43 and the light receiving surface 52 with the adhesive layer such as resin, it is possible to suppress total reflection of the incident light at the interface between the optical member 40 and the intermediate refractive index layer. In addition, the adhesive layer such as resin preferably has transmissivity of, for example, 80% or greater for the light emitted from the light emitting element 20. Consequently, most of the light that have reached the lower surface 43 of the optical member 40 reach the light receiving surface 52 without being totally reflected at the interface between the lower surface 43 and the adhesive layer.

Each of the light emitting surfaces 20E of the plurality of light emitting elements 20 faces the first reflecting surface 41 of the optical member 40. Each of the light emitting surfaces 20E of the plurality of light emitting elements 20 faces in the same direction. The plurality of light emitting elements 20 are aligned with each other. In the illustrated example, in a top view, the light emitting points of the plurality of light emitting elements 20 are aligned in the direction indicated by arrow 1D in the drawing, and the optical axes of the light emitted from the respective light emitting elements 20 are parallel to the direction indicated by arrow 2D in the drawing. The parallelism here includes a tolerance within ±5 degrees.

In the illustrated example of the light emitting device 100, the light emitting device 100 includes the three light emitting elements 20. Here, for convenience of explanation, the three light emitting elements 20 are distinguished as a first light emitting element 20A, a second light emitting element 20B, and a third light emitting element 20C, respectively. Further, the light emitted from the first light emitting element 20A is referred to as a first light, the light emitted from the second light emitting element 20B is referred to as a second light, and the light emitted from the third light emitting element 20C is referred to as a third light. The first light, the second light, and the third light are the lights of different colors selected from a red light, a green light, and a blue light, respectively. An embodiment in which three light emitting elements 20 are composed of the lights of three colors of RGB may be employed, for example, in a color image display application. Note that the colors of the lights emitted from the respective light emitting elements 20 are not limited thereto and is not limited to a visible light. The plurality of light receiving regions 53 provided on the light receiving surface 52 of the photodetector 50 include a first light receiving region 53A that receives part of the first light, a second light receiving region 53B that receives part of the second light, and a third light receiving region 53C that receives part of the third light.

Figure 8A:
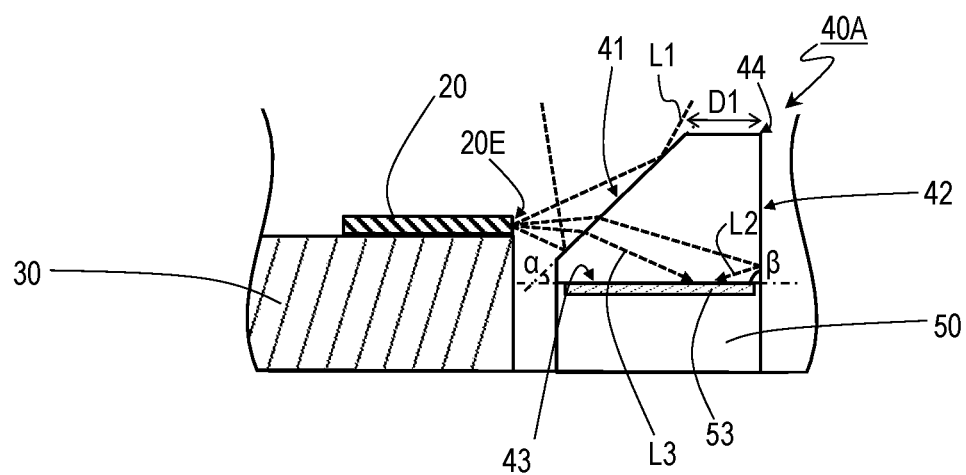
FIG. 8A is a diagram schematically illustrating an exemplary optical path of a light that passes through a first reflecting surface of the optical member and reaches a light receiving region of the photodetector.
Figure 9A:
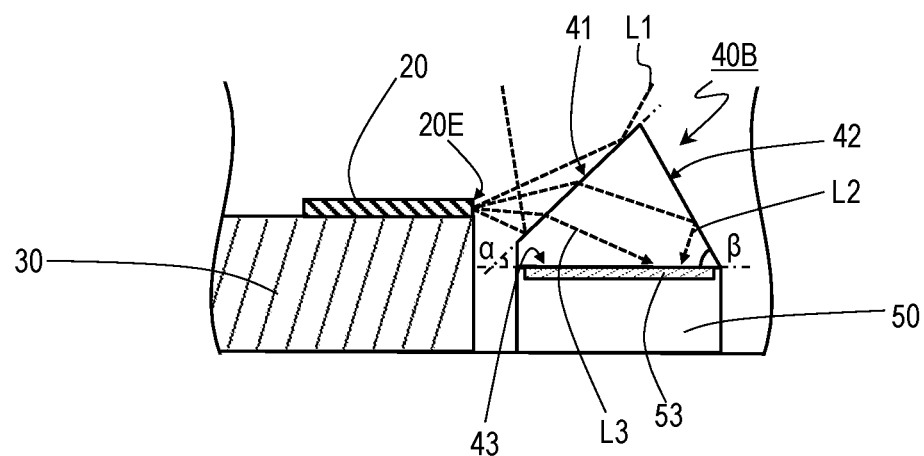
FIG. 9A is a diagram schematically illustrating an exemplary optical path of a light that passes through the first reflecting surface of another optical member and reaches the light receiving region of the photodetector.

In the light emitting device 100, an optical path of the light that passes through the first reflecting surface 41 and reaches the light receiving region 53 is schematically illustrated in FIGS. 8A and 9A. FIG. 8A is a diagram in which an optical member 40A is adopted as an example of the optical member 40, and FIG. 9A is a diagram in which an optical member 40B is adopted as an example of the optical member 40. In FIG. 8A, a flat plane including the lower surface 43 of the optical member 40 and a flat plane including the first reflecting surface 41 are indicated by alternate long and short dash lines, respectively. Further, in the both drawings, the main portion of the light emitted from the light emitting element 20 and the representative light rays included in the main portion of the light beam are indicated by broken lines. The light reflected by the first reflecting surface 41 is referred to as a light L1. The light that passes through the first reflecting surface 41, is reflected by the second reflecting surface 42, and reaches the light receiving region 53 is referred to as a light L2. The light that passes through the first reflecting surface 41 and reaches the light receiving region 53 without being incident on the second reflecting surface 42 is referred to as a light L3.

Figure 8B:
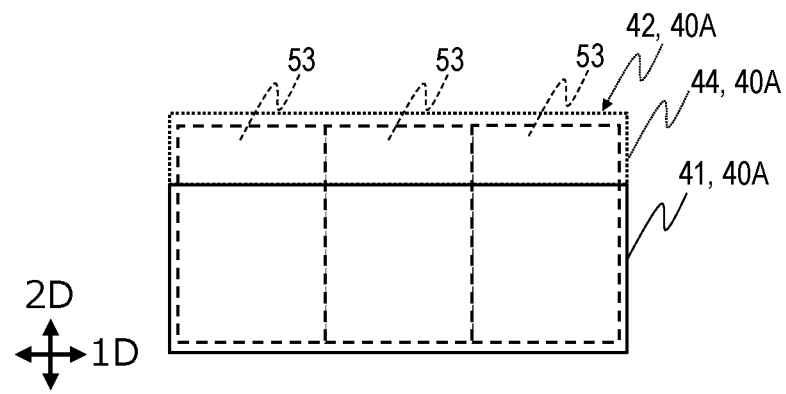
FIG. 8B is a top view illustrating a positional relationship between the first reflecting surface of the optical member and three light receiving regions provided on the light receiving surface of the photodetector.
Figure 9B:
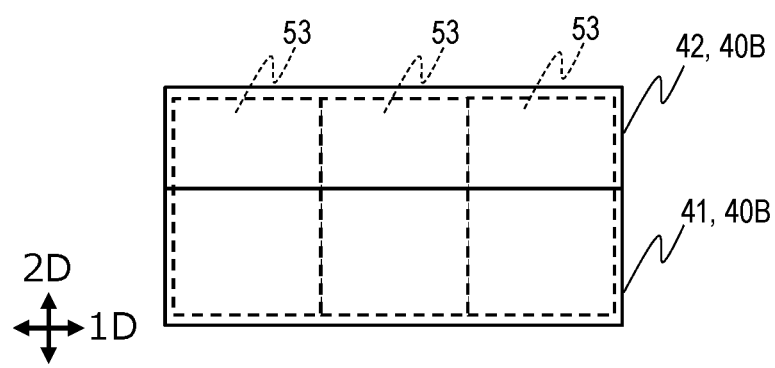
FIG. 9B is a top view illustrating a positional relationship between the first reflecting surface of the other optical member and the three light receiving regions provided on the light receiving surface of the photodetector.

FIGS. 8B and 9B are top views illustrating a positional relationship between the first reflecting surface 41 of the optical member 40 and the three light receiving regions 53 provided on the light receiving surface 52 of the photodetector 50. FIG. 8B corresponds to FIG. 8A and FIG. 9B corresponds to FIG. 9A, respectively. In FIG. 8B, the outer shape of the first reflecting surface 41 of the optical member 40 is indicated by a solid line, the outer shape of the top surface 44 of the optical member 40 is indicated by a dotted line, and the three light receiving regions 53 of the photodetector 50 are indicated by broken lines.

The optical member 40A has the first reflecting surface 41, the second reflecting surface 42, the lower surface 43, and the top surface 44. However, the top surface 44 of the optical member 40A may be omitted as necessary. That is, the first reflecting surface 41 may be in direct contact with the second reflecting surface 42.

As illustrated in FIG. 8A, in the optical member 40A, an angle α formed by a flat plane including the first reflecting surface 41 and a flat plane including the lower surface 43 or a flat plane including the light receiving surface 52 of the photodetector 50 is in a range from 10° to 80°, and preferably in a range from 35° to 55°, for example. Note that, in FIG. 8A, the angle α is an angle that turns counterclockwise from the flat plane including the lower surface 43 to the first reflecting surface 41, which is indicated by an alternate long and short dash line. In the optical member 40A, an angle β formed by the flat plane including the lower surface 43 or the flat plane including the light receiving surface 52 of the photodetector 50 and a flat plane including the second reflecting surface 42 is, for example, in a range from 80° to 100°. The angle β is an angle that turns clockwise from the lower surface 43 to the second reflecting surface 42. In the illustrated example, the angle α is 45° and the angle β is 90°.

The light receiving region 53 is located directly below an intersection point of a virtual straight line on the optical axis of the light L2 and the lower surface 43 of the optical member 40. Also, the light receiving region 53 is located directly below an intersection point of a virtual straight line on the optical axis of the light L3 and the lower surface 43 of the optical member 40.

As illustrated in FIG. 8B, in a top view, the outer shape of the optical member 40A encompasses the three light receiving regions 53. Part of the light receiving region 53 overlaps part of the first reflecting surface 41. Part of each of the three light receiving regions 53 overlaps the first reflecting surface 41. As the length of the top surface 44 in the second direction indicated by arrow 2D becomes short, contribution to reduction in the light emitting device 100 in that direction becomes large. Regarding the length in the 2D direction, the length of the lower surface 43 is less than twice the length of the first reflecting surface 41, preferably less than 1.5 times. A distance D1 between the first reflecting surface 41 and the second reflecting surface 42 in the optical axis direction of the light emitted from the light emitting element 20 is shorter than the length of the light receiving region 53 in the same direction. The distance D1 means the distance between the two reflecting surfaces located between the top surface 44 and the lower surface 43, and corresponds to the width of the top surface 44. Note that in the illustrated example of the light emitting device 100, the optical axis direction and the 2D direction coincide with each other.

The optical member 40B illustrated in FIGS. 9A and 9B differs from the optical member 40A illustrated in FIGS. 8A and 8B in that the inclination angle of the second reflecting surface 42 differs. Hereinafter, the differences from the optical member 40A will be mainly described, and the description of the common points will be omitted.

The angle β of the optical member 40B can be, for example, in a range from 30° to 80°. Similar to the optical member 40A, the optical member 40B may further have the top surface 44 that connects the first reflecting surface 41 and the second reflecting surface 42. In a top view, part of the light receiving region 53 overlaps part of the first reflecting surface 41, and part or all of the remaining part of the light receiving region 53 overlaps part of the second reflecting surface 42. Part of each of the three light receiving regions 53 overlaps the first reflecting surface 41, and the remaining part overlaps the second reflecting surface 42.

One or the plurality of protecting elements 60 are arranged inside the package 10. The protecting element 60 is arranged to protect the light emitting element 20. The protecting element 60 is arranged on a pair of wiring regions 14 provided on the stepped portion 13 of the package 10. In the light emitting device 100, one protecting element 60 is provided for one light emitting element 20. In other words, the same number of protecting elements 60 as the number of light emitting elements 20 are arranged. By arranging the protecting element 60 on the top surface of the stepped portion 13, it is possible to contribute to reducing the size of the light emitting device 100.

The optical member 40 is arranged such that the narrow portion of the stepped portion 13 is located on the back surface side of the optical member 40. The wide portion of the stepped portion 13 is arranged so as to sandwich the light emitting element 20 and the photodetector 50 in the first direction in a top view. Additionally, the wide portion of the stepped portion 13 is arranged on the opposite side of the narrow portion of the stepped portion 13 with the light emitting element 20 and the photodetector 50 interposed therebetween in the first direction.

The plurality of wires 70 electrically connect the light emitting elements 20 and the photodetector 50 to the wiring regions 14 of the package 10. One end of both ends of the plurality of wires 70 is joined to the wiring region 14 of the stepped portion 13. The one or the plurality of protecting elements 60 and the plurality of wires 70 are arranged on the wide portion of the stepped portion 13, and are not arranged on the narrow portion of the stepped portion 13.

The plurality of light emitting elements 20 emit the divergent light toward the first reflecting surface 41 of the optical member 40. The optical axis of the divergent light is parallel to the mounting surface 11M. The parallelism here includes a tolerance within ±5 degrees. As illustrated in FIG. 5, the plurality of light emitting elements 20A, 20B, and 20C each irradiate different regions of the first reflecting surface 41 of the optical member 40 with the main portion of the light.

In the light emitting device 100, a sealed and closed space is created inside the package 10. In addition, by joining the lateral wall portion 12 and the lid portion 16 of the package 10 under a predetermined atmosphere, a hermetically sealed and closed space is created inside the package 10. By hermetically sealing the space in which the light emitting element 20 is arranged, quality deterioration due to accumulated dust can be suppressed. Note that when the entire light emitting device 100 is used in an environment or an atmosphere where there is no need to worry about quality deterioration due to the influence of accumulated dust, moisture in air, or the like, the lid portion 16 is not required. For example, when the entire light emitting device 100 is sealed by an enclosure, the lid portion 16 does not need to cover the light emitting element 20.

The light emitted from the light emitting element 20 is reflected upwards at the first reflecting surface 41 and passes through the transmissive region of the lid portion 16 of the package 10, and exits to the outside from the light extracting surface 17. The central axis of the light to be extracted from the light extracting surface 17 is perpendicular to the light extracting surface 17. The verticality here includes a tolerance within ±5 degrees. However, the central axis of the light does not necessarily have to be perpendicular to the light extracting surface 17.

Figure 10:
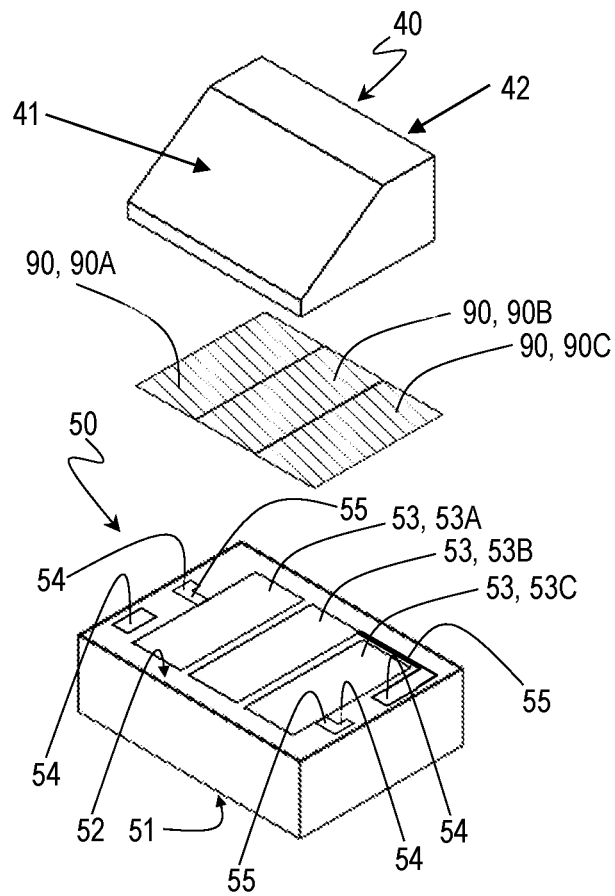
FIG. 10 is an exploded perspective view illustrating a state in which the optical member, one or a plurality of filters, and the photodetector are disassembled.
Figure 11:
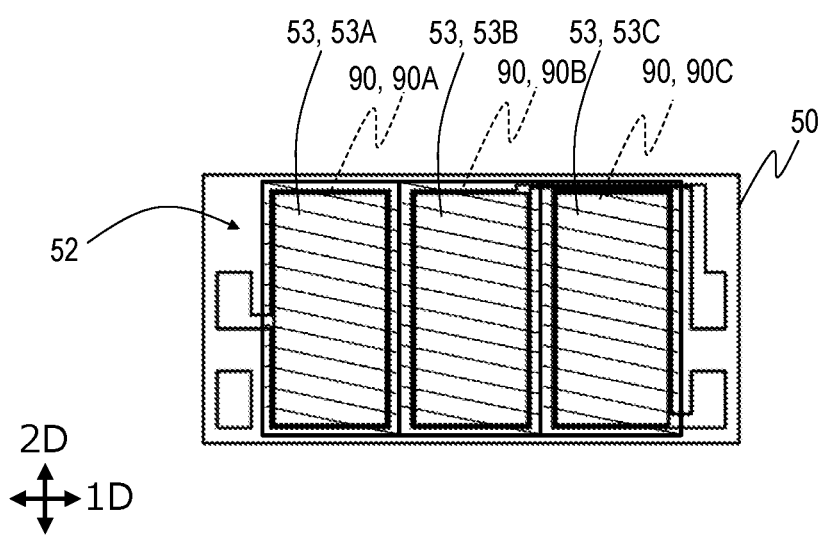
FIG. 11 is a top view illustrating the one or the plurality of filters arranged on the light receiving surface of the photodetector.

Next, an embodiment having a filter 90 will be described as a modified example of the light emitting device 100. In the light emitting device 100 including the plurality of light emitting elements 20 and the photodetector 50 having the plurality of light receiving regions 53, when it is desired to receive the light having different wavelengths by the respective light receiving regions 53, it is preferable to provide the filters 90 corresponding to the respective light receiving regions 53. FIGS. 10 and 11 are diagrams illustrating the light emitting device 100 provided with the filters 90 corresponding to the light receiving regions 53.

FIG. 10 is an exploded perspective view illustrating a state in which the optical member 40, the one or the plurality of filters 90, and the photodetector 50 are disassembled. FIG. 11 is a top view illustrating the one or the plurality of filters 90 arranged on the light receiving surface 52 of the photodetector 50.

The one or the plurality of filters 90 may be arranged between the optical member 40 and the photodetector 50. In the illustrated example, three filters 90 are arranged between the optical member 40 and the photodetector 50. The three filters 90 are wavelength selection filters, respectively and include a first filter, a second filter, and a third filter.

Hereinafter, the first filter, the second filter, and the third filter will be referred to as a filter 90A, a filter 90B, and a filter 90C, respectively.

The filter 90A is formed in a first region on the lower surface 43 of the optical member 40. The first region is a region on the lower surface 43 located directly above the light receiving region 53A on the light receiving surface 52 of the photodetector 50. The filter 90B is formed in a second region on the lower surface 43 of the optical member 40. The second region is a region on the lower surface 43 located directly above the light receiving region 53B on the light receiving surface 52 of the photodetector 50. The filter 90C is formed in a third region on the lower surface 43 of the optical member 40. The third region is a region on the lower surface 43 located directly above the light receiving region 53C on the light receiving surface 52 of the photodetector 50.

An example of the filter 90 is a dielectric multilayer film formed of $Ta_2O_5/SiO_2$, $TiO_2/SiO_2$, $Nb_2O_5/SiO_2$, or the like. A dielectric multilayer film having predetermined wavelength selectivity can be formed in each of the first region, the second region, and the third region on the lower surface 43 of the optical member 40.

First, attention is paid to two adjacent light emitting elements 20 among the three light emitting elements 20. The filter 90A has optical properties blocking the second light and selectively transmitting the first light. The filter 90B has optical properties blocking the first light and selectively transmitting the second light. The combination of the first light and the second light is, for example, a combination of two colors selected from RGB colors. However, a light other than the visible light, for example, an infrared light can be included as one light to be combined. As an example, when the first light is a red light and the second light is a green light, the filter 90A blocks the green light and selectively transmits the red light, and the filter 90B blocks the red light and selectively transmits the green light.

In a top view, the filter 90 may be arranged such that part or all of the filter 90 overlaps part or all of the light receiving region 53. In the example illustrated in FIG. 11, the entire filter 90A overlaps the entire light receiving region 53A, the entire filter 90B overlaps the entire light receiving region 53B, and the entire filter 90C overlaps the entire light receiving region 53C.

The light emitted from the one of the two adjacent light emitting elements 20 can reach the light receiving region 53 that is provided for detecting the monitor light of the light emitted from the other light emitting element 20, and the light emitted from the other of the two adjacent light emitting elements 20 can reach the light receiving region 53 that is provided for detecting the monitor light of the light emitted from the one light emitting element 20. So-called crosstalk can occur. When the distance between two adjacent light emitting elements is extremely narrow (for example, 0.5 mm or less), crosstalk is likely to occur. Crosstalk may promote the noise component of the electrical signal in the photoelectric conversion element and may be a factor of lowering an SN ratio. As a result, the detection accuracy of the monitor light to be detected may decrease.

According to the present embodiment, the filters 90 having wavelength selective characteristics different to each other are arranged on the two adjacent light receiving regions 53. In this way, mixing of the light emitted from the one of the two adjacent light emitting elements 20 into the light receiving region 53 that is provided for detecting the monitor light of the light emitted from the other light emitting element 20 can be suppressed, and mixing of the light emitted from the other of the two adjacent light emitting elements 20 into the light receiving region 53 that is provided for detecting the monitor light of the light emitted from the one light emitting element 20 can be suppressed. As a result, it is possible to suppress a decrease in the detection accuracy of the monitor light.

In the example of the light emitting device 100 illustrated in FIG. 5, the first light emitting element 20A and the third light emitting element 20C are respectively arranged on both sides of the second light emitting element 20B positioned at the center. In this case, the filter 90A has optical properties that block at least the second light and selectively transmit the first light. The filter 90A preferably has an optical property that further blocks the third light. This is because part of the third light emitted from the light emitting element 20C is also repeatedly reflected inside the optical member 40 and can eventually reach the light receiving region 53A. The filter 90B has optical properties that block the first light and the third light and selectively transmit the second light. The filter 90C has optical properties that block at least the second light and selectively transmit the third light. Similar to the filter 90A, the filter 90C preferably has an optical property that further blocks the first light.

In the present embodiment, the blocking of the light by the filter 90 means, for example, that the filter 90 has transmissivity of 5% or less for the light other than the light of the visible light having a wavelength that is selectively transmitted by the filter 90. The filter 90A has, for example, transmissivity of 90% or more for the red light and the transmissivity of 5% or less for the green light and the blue light. Similarly, the filter 90B has, for example, the transmissivity of 90% or more for the green light and the transmissivity of 5% or less for the red light and the blue light. The filter 90C has, for example, the transmissivity of 90% or more for the blue light and the transmissivity of 5% or less for the red light and the green light.

In a top view, part or all of the filter 90B is arranged so as to overlap the light receiving region 53B. Further, in a top view, part or all of the filter 90B is arranged so as not to overlap the light receiving region 53A and the light receiving region 53C. The plurality of filters 90 arranged on the lower surface 43 of the optical member 40 are separated from one another but are not necessarily separated from one another. The plurality of filters 90 may be arranged on the lower surface 43 at regular distances from each other. The distance is, for example, approximately several tens of μm.

In this manner, by arranging the filters 90 between the optical member 40 and the photodetector 50, in a light emitting device provided with a plurality of light emitting elements that emit light of different wavelengths, such as the light emitting device 100 provided with an RGB light emitting element, it is possible to measure the intensity of the light independently and accurately.

Although the embodiment according to the present invention has been described above, the light emitting device according to the present invention is not strictly limited to the light emitting device according to the above-described embodiment. That is, the present invention is not limited to the outer shape or structure of the light emitting device disclosed by the embodiment. For example, the light emitting device according to the present invention may be a light emitting device including no protecting element. In addition, the present invention may be applied without the premise that all the components are necessary and sufficient. For example, in a case in which some of the constituent elements of the light emitting device disclosed by the embodiment are not stated in claims, for the some of the constituent elements, the degree of freedom in design by those skilled in the art, such as substitutions, omissions, shape modifications, and material changes, is acknowledged, and then it is specified that the invention stated in the claims is applied.

The light emitting device according to the above-described embodiment can be used for head-mounted displays, projectors, lighting apparatuses, displays, and the like.

What is claimed is:

1. A light emitting device comprising:
a first light emitting element having a light emitting surface;
a second light emitting element having a light emitting surface;
an optical member having
a lower surface,
a first reflecting surface inclined to the lower surface, transmitting part of a first light emitted from the light emitting surface of the first light emitting element, and reflecting the rest of the first light in an upward direction, and
a second reflecting surface located farther from the light emitting surface of the first light emitting element than the first reflecting surface, and reflecting part or all of the first light passing through the first reflecting surface; and
a photodetector located below the optical member and having a top surface provided with one or a plurality of light receiving regions including a first light receiving region configured to receive the first light reflected by the second reflecting surface, wherein:
in a top view, part or all of the first light receiving region overlaps part or all of the first reflecting surface,
the first reflecting surface of the optical member transmits part of a second light emitted from the light emitting surface of the second light emitting element and reflects the rest of the second light in an upward direction,
the second reflecting surface reflects part or all of the second light passing through the first reflecting surface, and
the one or the plurality of light receiving regions provided on the top surface of the photodetector further comprises a second light receiving region configured to receive the second light reflected by the second reflecting surface.

2. The light emitting device according to claim 1, wherein the second reflecting surface is not parallel to the lower surface of the optical member.

3. The light emitting device according to claim 1, wherein an angle of the optical member formed by a flat plane including the top surface of the photodetector and a flat plane including the second reflecting surface of the optical member is in a range from 80° to 100°.

4. The light emitting device according to claim 1, wherein an angle of the optical member formed by a flat plane including the top surface of the photodetector and a flat plane including the second reflecting surface of the optical member is in a range from 30° to 80°.

5. The light emitting device according to claim 1, wherein, in the top view, a whole of the first light receiving region overlaps the optical member.

6. The light emitting device according to claim 1, wherein, in the top view, part of the first light receiving region overlaps part or all of the first reflecting surface, and part or all of a remaining part of the first light receiving region overlaps part or all of the second reflecting surface.

7. The light emitting device according to claim 1, wherein a distance between the first reflecting surface and the second reflecting surface in an optical axis direction of the first light emitted from the first light emitting element is shorter than a length of the first light receiving region in the optical axis direction.

8. The light emitting device according to claim 1, wherein the first light receiving region further receives the first light passing through the first reflecting surface of the optical member and not being reflected by the second reflecting surface.

9. The light emitting device according to claim 1, further comprising:
   a third light emitting element having a light emitting surface, wherein:
   the first reflecting surface of the optical member transmits part of a third light emitted from the light emitting surface of the third light emitting element and reflects the rest of the third light in an upward direction,
   the second reflecting surface reflects part or all of the third passing through the first reflecting surface,
   the one or the plurality of light receiving regions provided on the top surface of the photodetector further comprises a third light receiving region configured to receive the third light reflected by the second reflecting surface, and
   each of the first light, the second light, and the third light is a light having a color different from each other and selected from a red light, a green light, and a blue light.

10. The light emitting device according to claim 9, wherein:
    the second light emitting element and the third light emitting element are respectively arranged on both sides of the first light emitting element,
    the optical member is provided with a first filter formed in a first region of the lower surface, and
    the first filter blocks the second light and the third light, and is arranged in a state in which part or all of the first filter overlaps part or all of the first light receiving region in the top view.

11. The light emitting device according to claim 10, wherein, in the top view, the first filter is arranged in a state in which part or all of the first filter does not overlap the second light receiving region and the third light receiving region.

12. The light emitting device according to claim 1, wherein:
    the optical member is provided with a first filter formed in a first region on the lower surface and a second filter formed in a second region on the lower surface,
    the first filter blocks the second light and is arranged in a state in which part or all of the first filter overlaps part or all of the first light receiving region in the top view, and
    the second filter blocks the first light and is arranged in a state in which part or all of the second filter overlaps part or all of the second light receiving region in the top view.

13. The light emitting device according to claim 1, further comprising:
    a package having:
      a bottom portion having a mounting surface on which the first light emitting element is arranged,
      a lateral wall portion surrounding the first light emitting element, and
      a lid portion fixed to the lateral wall portion above the bottom portion and having a light extracting surface, wherein:
      a light emitted from the first light emitting element and reflected upward by the first reflecting surface of the optical member passes through the lid portion and exits to an outside from the light extracting surface.

14. The light emitting device according to claim 1, wherein the first light emitting element is a semiconductor laser element.

15. A light emitting device comprising:
    a first light emitting element having a light emitting surface;
    an optical member having
      a lower surface,
      a first reflecting surface inclined to the lower surface, transmitting part of a first light emitted from the light emitting surface of the first light emitting element, and reflecting the rest of the first light in an upward direction, and
      a second reflecting surface located farther from the light emitting surface of the first light emitting element than the first reflecting surface, and reflecting part or all of the first light passing through the first reflecting surface; and
    a photodetector located below the optical member and having a top surface provided with one or a plurality of light receiving regions including a first light receiving region configured to receive the first light reflected by the second reflecting surface, wherein:
    in a top view, part or all of the first light receiving region overlaps part or all of the first reflecting surface, and
    in the top view, part of the first light receiving region overlaps part or all of the first reflecting surface, and part or all of a remaining part of the first light receiving region overlaps part or all of the second reflecting surface.

16. The light emitting device according to claim 15, wherein in the top view, part of the first light receiving region overlaps part or all of the first reflecting surface, and all of a remaining part of the first light receiving region overlaps part or all of the second reflecting surface.

17. The light emitting device according to claim 16, wherein an angle of the optical member formed by a flat plane including the top surface of the photodetector and a flat plane including the second reflecting surface of the optical member is in a range from 30° to 80°.

18. A light emitting device comprising:
    a first light emitting element having a light emitting surface;
    an optical member having
      a lower surface,
      a first reflecting surface inclined to the lower surface, transmitting part of a first light emitted from the light emitting surface of the first light emitting element, and reflecting the rest of the first light in an upward direction, and
      a second reflecting surface located farther from the light emitting surface of the first light emitting element than the first reflecting surface, and reflecting part or all of the first light passing through the first reflecting surface; and
    a photodetector located below the optical member and having a top surface provided with one or a plurality of light receiving regions including a first light receiving region configured to receive the first light reflected by the second reflecting surface, wherein:
    in a top view, part or all of the first light receiving region overlaps part or all of the first reflecting surface, and a distance between the first reflecting surface and the second reflecting surface in an optical axis direction of the first light emitted from the first light emitting element is shorter than a length of the first light receiving region in the optical axis direction.

19. The light emitting device according to claim 18, wherein an angle of the optical member formed by a flat plane including the top surface of the photodetector and a flat plane including the second reflecting surface of the optical member is in a range from 80° to 100°.

20. The light emitting device according to claim 18, wherein an angle of the optical member formed by a flat plane including the top surface of the photodetector and a flat plane including the second reflecting surface of the optical member is in a range from 30° to 80°.

* * * * *